(12) United States Patent
Yanagihara

(10) Patent No.: US 7,956,535 B2
(45) Date of Patent: Jun. 7, 2011

(54) LIGHT EMITTING DEVICE AND ELECTRONIC APPARATUS

(75) Inventor: Hirokazu Yanagihara, Chino (JP)

(73) Assignee: Seiko Epson Corporation, Tokyo (JP)

( * ) Notice: Subject to any disclaimer, the term of this patent is extended or adjusted under 35 U.S.C. 154(b) by 186 days.

(21) Appl. No.: 12/329,691

(22) Filed: Dec. 8, 2008

(65) Prior Publication Data

US 2009/0153044 A1    Jun. 18, 2009

(30) Foreign Application Priority Data

Dec. 18, 2007 (JP) ................................ 2007-325590

(51) Int. Cl.
*H01L 51/52* (2006.01)
(52) U.S. Cl. ........................................... 313/506
(58) Field of Classification Search .................. 313/504, 313/500, 503, 506
See application file for complete search history.

(56) References Cited

U.S. PATENT DOCUMENTS

| | | | | |
|---|---|---|---|---|
| 5,294,869 A | * | 3/1994 | Tang et al. ..................... | 313/504 |
| 2002/0167267 A1 | * | 11/2002 | Sekiya .......................... | 313/500 |
| 2004/0113547 A1 | * | 6/2004 | Son et al. ...................... | 313/504 |

FOREIGN PATENT DOCUMENTS

| | | |
|---|---|---|
| JP | A 10-151755 | 6/1998 |
| JP | A 2001-185354 | 7/2001 |
| JP | A 2002-075640 | 3/2002 |
| JP | A 2003-208979 | 7/2003 |

* cited by examiner

*Primary Examiner* — Joseph L Williams
*Assistant Examiner* — Andrew J Coughlin
(74) *Attorney, Agent, or Firm* — Oliff & Berridge PLC

(57) ABSTRACT

A light emitting device includes a substrate, a plurality of pixel electrodes arranged in a matrix on the substrate, and a counter electrode disposed opposite the plurality of pixel electrodes. Here, the plurality of pixel electrodes includes a first pixel electrode group including two or more of the plurality of pixel electrodes arranged continuously in a first direction and the first pixel electrode group includes a first pixel electrode and a second pixel electrode arranged to be adjacent to each other and a third pixel electrode and a fourth pixel electrode arranged to be adjacent to each other. A first division portion is disposed between the first pixel electrode and the second pixel electrode and a second division portion is disposed between the third pixel electrode and the fourth pixel electrode. At least one light-emitting function layer including a plurality of layers including a light-emitting layer is formed between two or more pixel electrodes located between the first division portion and the second division portion in the first pixel electrode group and the counter electrode to cover the two or more pixel electrodes located between the first division portion and the second division portion.

9 Claims, 11 Drawing Sheets

CROSS-SECTIONAL VIEW TAKEN ALONG LINE V–V

LIGHT EMITTING DEVICE AND ELECTRONIC APPARATUS

BACKGROUND

1. Technical Field

The present invention relates to a light emitting device emitting light by electroluminescence and an electronic apparatus having the light emitting device.

2. Related Art

An organic light emitting diode (OLED), that is, an organic electroluminescent (EL) element, is known as a light emitting source small in thickness and weight. The organic EL element has a structure in which at least one organic thin film formed of an organic material is interposed between a pixel electrode and a counter electrode. Current flows in the organic thin film at the same as flowing in both electrodes, whereby the organic film or the organic EL element emits light.

When plural organic EL elements are arranged and the light emission and the light non-emission of each organic EL element are properly controlled, it is possible to display an image having a desired meaning.

Such an organic EL element or an image display device having the organic EL element is disclosed in, for example, JP-A-2001-185354.

In the above-mentioned image display device, it is desirable that the amount of the organic thin film is constant in the respective organic EL elements and is actually in a constant range. Otherwise, the amount of the organic EL material contributing to the emission of light may vary, thereby causing unevenness in brightness. This requirement results in the requirement that when the organic thin film is formed by a liquid droplet ejecting method (ink jet method), the amounts of ejected liquid or ink droplets should be even in the respective organic EL elements.

However, it is usually difficult to solve the above-mentioned problem. This is for various reasons not being completely controlled, such as unevenness in amount of ejected droplets by ejections in the liquid droplet ejecting method (ink jet method) and unevenness in dryness of the respective organic EL elements in the process of drying the ejected liquid or ink droplets.

Such reasons can be removed to some extent by very strictly controlling the manufacturing processes. However, it is needless to say that the limitation in cost exists therein. As a result, it is desirable for preventing the occurrence of unevenness in brightness that the requirement for evenness in amount of the organic thin film all over the organic EL elements and the requirements for simplification and facilitation in manufacturing processes should be accomplished.

A technique of allowing an "EL layer" formed by an ink jet method to extend over "plural pixel electrodes" (see claim 1 of JP-A-2001-185354), and more specifically, a technique of forming the EL layer in a "stripe shape" or "an elliptical or rectangular shape" (see Abstract or FIG. 1 of JP-A-2001-185354), is described in JP-A-2001-185354. Accordingly, in JP-A-2001-185354, it is described that "it is possible to form the EL layer and thus to reduce the processing time by continuously scanning an ink jet head" (see [0010] of JP-A-2001-185354). Therefore, according to the technique disclosed in JP-A-2001-185354, the facilitation in manufacturing processes is accomplished in the meaning.

However, the above-mentioned problem in the drying process may occur. For example, as shown in FIG. 1 of JP-A-2001-185354, when the EL layer is formed in the "stripe shape", the amount of before-drying material liquid droplets in the longitudinal direction and the lateral direction about one point therein greatly varies (that is, the former is far greater in general). In consideration of a general nature that the liquid or ink droplets are dried from the ends thereof, the unevenness in dryness (evenness in dryness in plural pixel electrodes) can easily occur in this case.

Organic thin films emitting different colors of light, respectively, are formed in the organic EL elements. For example, an organic EL element includes a first organic thin film and an organic EL element adjacent thereto includes a second organic thin film. In this case, for some reasons, the second organic thin film may be mixed into a place where the first organic thin film should be disposed (see [0006] of JP-A-2002-75640). In this case, the mixed organic EL element may not emit light as originally expected. In consideration of this state, the technique disclosed in JP-A-2001-185354 is very disadvantageous. In JP-A-2001-185354, when the above-mentioned event of mixture occurs, the "entire" pixels in a column may not emit light as expected.

This is true in JP-A-2002-75640 and JP-A-2003-208979. JP-A-2002-75640 discloses a technique of forming a "groove" and "allowing an organic EL material to flow in the groove along a nozzle" (see claim 1 and FIG. 2 or 5 in JP-A-2002-75640). JP-A-2003-208979 discloses a technique of ejecting liquid droplets to cells including plural pixels continuously arranged and partitioned by partition walls (see "stripe shape" described and shown in claim 1, [0021], FIG. 1, and claim 2 of JP-A-2003-208979). As can be clearly seen from the above description, JP-A-2002-75640 and JP-A-2003-208979 do not solve the problem described with reference to JP-A-2001-185354.

On the other hand, JP-A-10-151755 discloses an ink jet recording method (Title of the Invention of JP-A-10-151755) of ejecting ink so that the ink ejected in plural scanning operations is arranged in a line with a constant interval (see claim 1, [0010], and [0148] of JP-A-10-151755), so as to accomplish the object of distributing the ink in a line without unevenness, which is described in [0008] of JP-A-10-151755. When this technique is applied to manufacturing the organic EL element or the image display device, the amount of organic thin film in each organic EL element can be made to be in a predetermined range to some extent.

However, it is considered that the technique described in JP-A-10-151755 is on the premise of the "plural scanning operations" and plural scanning operations on the same pixels are required to obtain a satisfactory advantage. Then, the time from the start of process to the end of process is elongated. From this point of view, the contribution of JP-A-10-151755 to the facilitation of manufacture is not great.

SUMMARY

An advantage of some aspects of the invention is that it provides a light emitting device capable of solving all or a part of the above-mentioned two problems of the prevention of uneven brightness from occurrence and the facilitation of manufacture and an electronic apparatus having the light emitting device.

Another advantage of some aspects of the invention is to solve problems accompanied therewith.

According to an aspect of the invention, there is provided a light emitting device including: a substrate; a plurality of pixel electrodes arranged in a matrix on the substrate; and a counter electrode disposed opposite the plurality of pixel electrodes. Here, the plurality of pixel electrodes includes a first pixel electrode group including two or more of the plurality of pixel electrodes arranged continuously in a first direction and the first pixel electrode group includes a first pixel electrode and a second pixel electrode arranged to be adjacent to each other and a third pixel electrode and a fourth pixel electrode arranged to be adjacent to each other. A first division portion is disposed between the first pixel electrode and the second pixel electrode and a second division portion is disposed between the third pixel electrode and the fourth pixel electrode. At least one light-emitting function layer including a plurality of layers including a light-emitting layer is formed between two or more pixel electrodes located between the first division portion and the second division portion in the first pixel electrode group and the counter electrode to cover the two or more pixel electrodes located between the first division portion and the second division portion.

The light emitting device according to the aspect of the invention may further include a partition wall layer having a plurality of openings including a first opening between the substrate and the counter electrode and an interlayer insulating film disposed between the substrate and the plurality of pixel electrodes. Here, the first opening receives the two or more pixel electrodes located between the first division portion and the second division portion, the first division portion is formed of a part of the partition wall layer or a part of the interlayer insulating film, and the second division portion is formed of a part of the partition wall layer or a part of the interlayer insulating film.

In the light emitting device according to the first embodiment of the invention, at least a part of the first division portion and the second division portion may have a liquid repellency property relative to the material of the light-emitting layer.

In the light emitting device according to the aspect of the invention, the two or more pixel electrodes located between the first division portion and the second division portion and including the second pixel electrode and the third pixel electrode may include a fifth pixel electrode and a sixth pixel electrode arranged to be adjacent to each other, a third division portion formed of a part of the interlayer insulating film may be disposed between the fifth pixel electrode and the sixth pixel electrode, and the layer of the light-emitting function layer closest to the substrate may be divided by the third division portion.

In the light emitting device according to the aspect of the invention, the second division portion may be formed of a part of the interlayer insulating film and the width of the second division portion in the first direction may be greater than that of the third division portion.

In the light emitting device according to the aspect of the invention, the plurality of pixel electrodes may include a second pixel electrode group including two or more pixel electrodes arranged continuously in the first direction to form a column different from the column of the first pixel electrode group, the second pixel electrode group may include a seventh pixel electrode arranged in the same row as the first pixel electrode in the first direction and an eighth pixel electrode arranged in the same row as the second pixel electrode in the first direction, and a division portion corresponding to the first division portion may not be disposed between the seventh electrode and the eighth electrode.

In the light emitting device according to the aspect of the invention, the plurality of openings may include a second opening, and the second opening may be disposed at a position adjacent to the first opening in the first direction and receives at least the first pixel electrode therein.

In the light emitting device according to the aspect of the invention, the light-emitting function layer may be formed by a liquid droplet ejecting method (ink jet method).

According to another aspect of the invention, there is provided an electronic apparatus including the above-mentioned light emitting device.

The light emitting device according to the aspect of the invention includes a substrate, a plurality of pixel electrodes arranged in a matrix on the substrate, a plurality of light-emitting elements disposed to correspond to the pixel electrodes, each having one pixel electrode, a counter electrode, and a light-emitting function layer interposed therebetween, and division portions dividing the light-emitting function layer into plural portions in the column direction of the matrix arrangement. The arrangement pattern of the division portions in a certain column in the matrix arrangement is different from that of another column.

According to the aspect of the invention, the light-emitting function layer is divided into plural portions by the division portions. In this case, the number of light-emitting function layers (that is, the number of the "plural portions") divided by the "division portions" in a certain column of the matrix arrangement may be different from the number of pixel electrodes arranged in the column. Accordingly, when the number of the former is smaller than the number of latter and the number of light-emitting function layers formed between the "division portions" is one, the light-emitting function layers for the plural pixel electrodes existing in the same section are formed at a time. From this point of view, the facilitation of manufacture is guaranteed.

In the invention, for example, as described above, since a groove having a "stripe shape" is not disposed over the entire length of the substrate but the light-emitting function layer is divided into a proper number of portions by the division portions, there does not occur that a problem (for example, the above-mentioned "mixture") in a place in the light-emitting function layer affects the "entire" pixels. From this point of view, the facilitation of manufacture is also guaranteed.

Due to the existence of the "division portions", when the light-emitting function layer is formed by a liquid droplet ejecting method (ink jet method), the drying start point of the liquid or ink droplets can be set to a position where the division portions exist or the vicinity thereof (the dryness of the liquid or ink droplets starts from its end).

In the invention, the arrangement pattern of the "division portions" in a certain column is different from that in a different column. That is, a certain column and a different column are generally different in drying start point from each other, and are generally different in drying end point. For example, a point in a column just aside a drying start point (that is, the division portion and the vicinity thereof) in a certain column is a drying end point.

Accordingly, like unevenness in dryness does not occur over the entire substrate. For example, when the groove having a "stripe shape" extending over the entire length of the substrate is formed, the drying start point is ends of the groove and the drying end point is the center of the groove in the longitudinal direction. Accordingly, when the grooves are arranged on the substrate, the drying end points may be arranged in a line crossing the substrate. As a result, an event that the condensation of effective components such as the organic EL material is concentrated on a specific area may occur. Then, the unevenness in brightness becomes more visible in the image display using the entire light-emitting elements.

Such a problem does not occur in the invention.

As a result, according to the invention, it is possible to improve the facilitation of manufacture and to prevent the unevenness in brightness from occurring.

The "light-emitting element" described in the invention is on the premise that it is an element in which current flows in the light-emitting function layer with current flowing between the pixel electrode and the counter electrode to allow the light-emitting function layer to emit light.

In the light emitting device according to the invention, partition wall layers are formed on the substrate so as to receive one or more of the pixel electrodes arranged in the column direction of the matrix arrangement and the division portions includes the partition wall layers.

According to this configuration, the "division portions" are generally formed of a member called "bank."

In the invention, the layer having such a nature of "forming the plural openings" is called a "partition wall layer," because a partition wall exists a certain opening and an opening adjacent thereto in a sectional view of the layer.

In the light emitting device according to the invention, at least a part of the division portions may have a liquid repellency property relative to the liquid droplets of the light-emitting function layer.

According to this configuration, the "division portions" have a liquid repellency property. Accordingly, when the light-emitting function layer is formed by a liquid droplet ejecting method (ink jet method), the liquid or ink droplets are bounded from the positions of the division portions or the vicinities thereof. That is, in the configuration, the "division portions" have a more excellent function.

A specific example of the "division portion" can include a "convex portion" having a thickness smaller than the thickness of the partition wall layer, in addition to the "partition wall layer" or the portion having the "liquid repellency property."

In this configuration, an electrode-forming base film providing a base surface for forming the pixel electrodes may be further provided and the division portions may include a part of the base surface.

Accordingly, the division portion having the liquid repellency property includes a part of the base surface of the electrode-forming base film. That is, in this configuration, since a particular member is not provided to form the "division portion" but the "division portion" can be formed of a member necessarily required for forming the light emitting device, it is possible to further improve the facilitation of manufacture in view of reduction in material cost and manufacturing cost.

Alternatively, in the light emitting device according to the invention, a certain column group of the columns of the matrix arrangement may include a light-emitting function layer emitting light to the certain column group as the light-emitting function layer and the arrangement patterns of the column groups adjacent to the certain column group may be different from each other.

According to this configuration, for example, when the number of columns is N (where N is a positive integer), a "first column group" including the first, fourth, seventh, . . . , (N-2)-th columns correspond to red, a "second column group" including the second, fifth, eighth, . . . , (N-1)-th columns correspond to green, and a "third column group" including the third, sixth, ninth, . . . , N-th columns correspond to blue.

In this case, since the first, second, and third column groups "have the light-emitting function layers emitting light" of red, green, and blue, respectively, the light-emitting function layers are formed in a series but at different times. For example, when the liquid droplet ejecting method (ink jet method) is used, a process of ejecting ink including the organic EL materials emitting the light of colors and then drying the ink is performed three times.

The idea that the drying start points and the drying end points are dispersed in the entire substrate can be suitably used every processing time. This is because the occurrence of the same unevenness in dryness can be suppressed for the colors.

In this configuration, paying attention to the above-mentioned specific example, the arrangement patterns of the division portions in the first column and the fourth column corresponding to red are different from each other (the same is true between the eighth column and the eleventh column corresponding to green, between the 57-th column and the 60-th column corresponding to blue, and the like). That is, in this configuration, the dispersion of the drying start points and the drying end points in the entire substrate is embodied for each color.

Accordingly, according to this configuration, such an advantage is more effectively realized in the invention.

Alternatively, in the light emitting device according to the invention, the light-emitting function layer may include the light-emitting layer emitting light and one or more other layers and the division portions may divide at least one of the light-emitting layer and the one or more other layers, thereby dividing the light-emitting function layer into plural portions.

According to this configuration, the light-emitting function layer includes some or all of an electron blocking layer, a hole injection layer, a hole transport layer, an electron transport layer, an electron injection layer, and a hole blocking layer, in addition to the light-emitting layer. In this configuration, the "division portions" divide the light-emitting function layer into plural portions by dividing at least one layer of the above-mentioned layers. In this case, the above-mentioned advantage is exhibited in the divided layers.

Specifically speaking, according to this configuration, even when, for example, the light-emitting layer is formed in the "stripe shape" like the past, at least one other layer can enjoy the above-mentioned advantage. Accordingly, paying attention to the entire light-emitting function layer, the above-mentioned advantage can be enjoyed to a certain extent. That is, the facilitation of manufacture can be further improved thanks to the former and the specific advantage of the invention can be enjoyed thanks to the latter. In other words, better advantages can be selected.

In the aspect, the division portions may include first division portions dividing the light-emitting layer into plural portions in the column direction and second division portions dividing one of the one or more other layers into plural portions in the column direction and the arrangement pattern of the first division portions in a certain column in the matrix arrangement may be different from the arrangement pattern of the second division portions in the column.

As a result, at least the light-emitting layer and another layer are subjected to the "division." In this case, the "division" is performed on the former by the "first division portions" and is performed on the latter by the "second division portions."

In the aspect, the arrangement pattern of the first division portions in a certain column in the matrix arrangement is different from the arrangement pattern of the second division portions in the column. That is, the dryness in the process of drying the light-emitting layer is different from that in the process of drying another layer.

Accordingly, according to this aspect, the above-mentioned advantage of the invention can be repeatedly enjoyed in the direction perpendicular to the surface of the substrate.

In the aspect, it is enough as long as the condition (hereinafter, referred to as "condition I") that "the arrangement pattern of the division portions in a certain column is different from the arrangement pattern of the division portions in another column" is satisfied by at least one of the first division portions and the second division portions. With this idea, for example, the "second division portions" in this aspect need not satisfy condition I as long as it satisfies the condition specific to the aspect that the arrangement pattern thereof is "different from the arrangement pattern of the first division portions." In this case, the second division portions may be regularly arranged with respect to the entire surface of the substrate.

In the light-emitting device according to the invention, the light-emitting function layer may be formed by the liquid droplet ejecting method (ink jet method).

As can be clearly seen from the above description, this configuration is suitable for effectively enjoying the advantages of the invention.

The electronic apparatus according to the invention includes the above-mentioned various light emitting devices to accomplish the above-mentioned advantages.

Since the electronic apparatus includes the above-mentioned various light-emitting device, it can be easily manufactured and can display an image with high precision.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, a first embodiment of the invention will be described with reference to FIGS. 1 to 6. In these drawings and FIG. 7 and the drawings subsequent thereto referred to later, the sizes of the elements are properly different from actual sizes.

Figure 1:
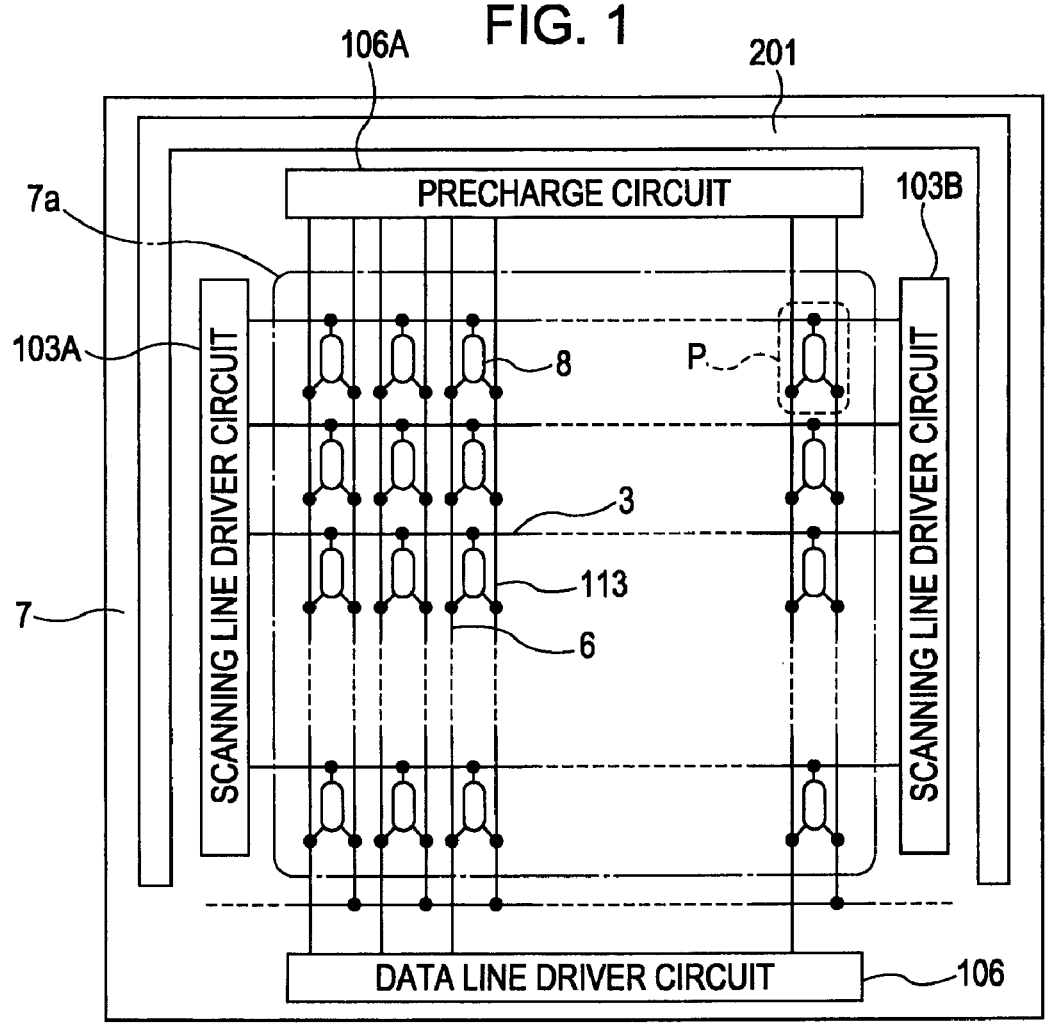
FIG. 1 is a plan view schematically illustrating a configuration of an organic EL device according to a first embodiment of the invention.

FIG. 1 is a plan view illustrating an organic EL device according to a first embodiment of the invention.

In FIG. 1, the organic EL device includes an element substrate 7 and various elements formed on the element substrate 7. The various elements include organic EL elements 8, scanning lines 3, data lines 6, scanning line driver circuits 103A and 103B, a data line driver circuit 106, a precharge circuit 106A, and a counter-electrode power supply line 201.

Plural organic EL elements (light-emitting elements) 8 are disposed on the element substrate 7 as shown in FIG. 1, and the plural organic EL elements 8 are arranged in a matrix. Each organic EL element 8 includes a pixel electrode, a light-emitting function layer, and a counter electrode. The elements will be described in detail later.

An image display area 7a is an area in which the plural organic EL elements 8 are arranged on the element substrate 7. In the image display area 7a, a desired image can be displayed on the basis of the emission and non-emission of light of the individual organic EL elements 8. In the following description, the area on the surface of the element substrate 7 other than the image display area 7a is referred to as a "peripheral area."

The scanning lines 3 and the data lines 6 are arranged to correspond to the columns and rows of the organic EL elements 8 arranged in a matrix. More specifically, as shown in FIG. 1, the scanning lines 3 extend in the horizontal direction in the drawing and are connected to the scanning line driver circuits 103A and 103B formed in the peripheral area. The data lines 6 extend in the vertical direction in the drawing and are connected to the data line driver circuit 106 formed in the peripheral area. Unit circuits (pixel circuits) P including the organic EL element 8 are disposed in the vicinity of intersections of the scanning lines 3 and the data lines 6.

Figure 2:
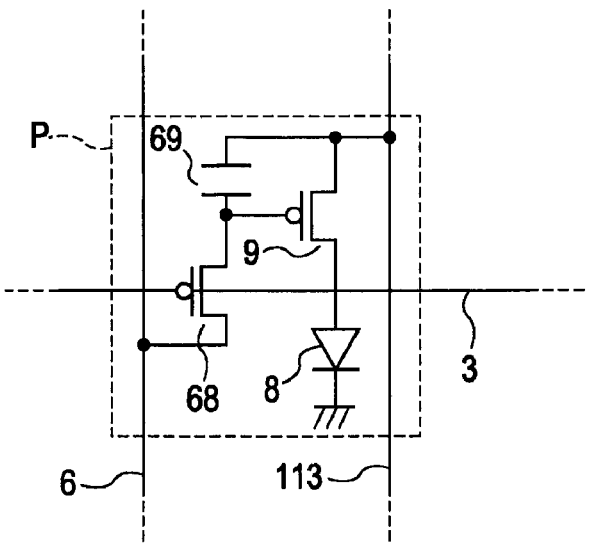
FIG. 2 is a circuit diagram illustrating details of a unit circuit P shown in FIG. 1.

As shown in FIG. 2, each unit circuit P includes the organic EL element 8, an n-channel first transistor 68, a p-channel second transistor 9, and a capacitor element 69.

The unit circuit P is supplied with power from a current supply line 113. The plural current supply lines 113 are connected to a power source not shown.

The source electrode of the p-channel second transistor 9 is connected to the current supply line 113 and the drain electrode thereof is connected to the pixel electrode of the organic EL element 8. The capacitor element 69 is disposed between the source electrode and the gate electrode of the second transistor 9. The gate electrode of the n-channel first transistor 68 is connected to the corresponding scanning line 3, the source electrode is connected to the corresponding data line 6, and the drain electrode is connected to the gate electrode of the second transistor 9.

When the scanning line driver circuits 103A and 103B select a scanning line 3 corresponding to a unit circuit P, the first transistor 68 of the unit circuit P is turned on and a data signal supplied through the data line 6 is held by the capacitor element 69. Then, the second transistor 9 supplies current corresponding to the level of the data signal to the organic EL element 8. Accordingly, the organic EL element 8 emits light with brightness corresponding to the level of the data signal.

The precharge circuit 106A is disposed in the peripheral area on the element substrate 7. The precharge circuit 106A serves to set the data lines 6 to a predetermined potential before recording the data signals to the organic EL elements 8.

The counter-electrode power supply line 201 (hereinafter, simply referred to as "power supply line 201") has a Π shape in a plan view to almost correspond to the outline of the element substrate 7. The power supply line 201 supplies, for example, a source voltage of a ground level to the counter electrode of the organic EL elements 8.

Although it has been described that the scanning line driver circuits 103A and 103B, the data line driver circuit 106, and the precharge circuit 106 are all formed on the element substrate 7, all or a part thereof may be formed in a flexible board in some cases. In this case, the flexible board and the element substrate 7 can be electrically connected to each other by disposing appropriate terminals in contact portions therebetween.

Figure 3:
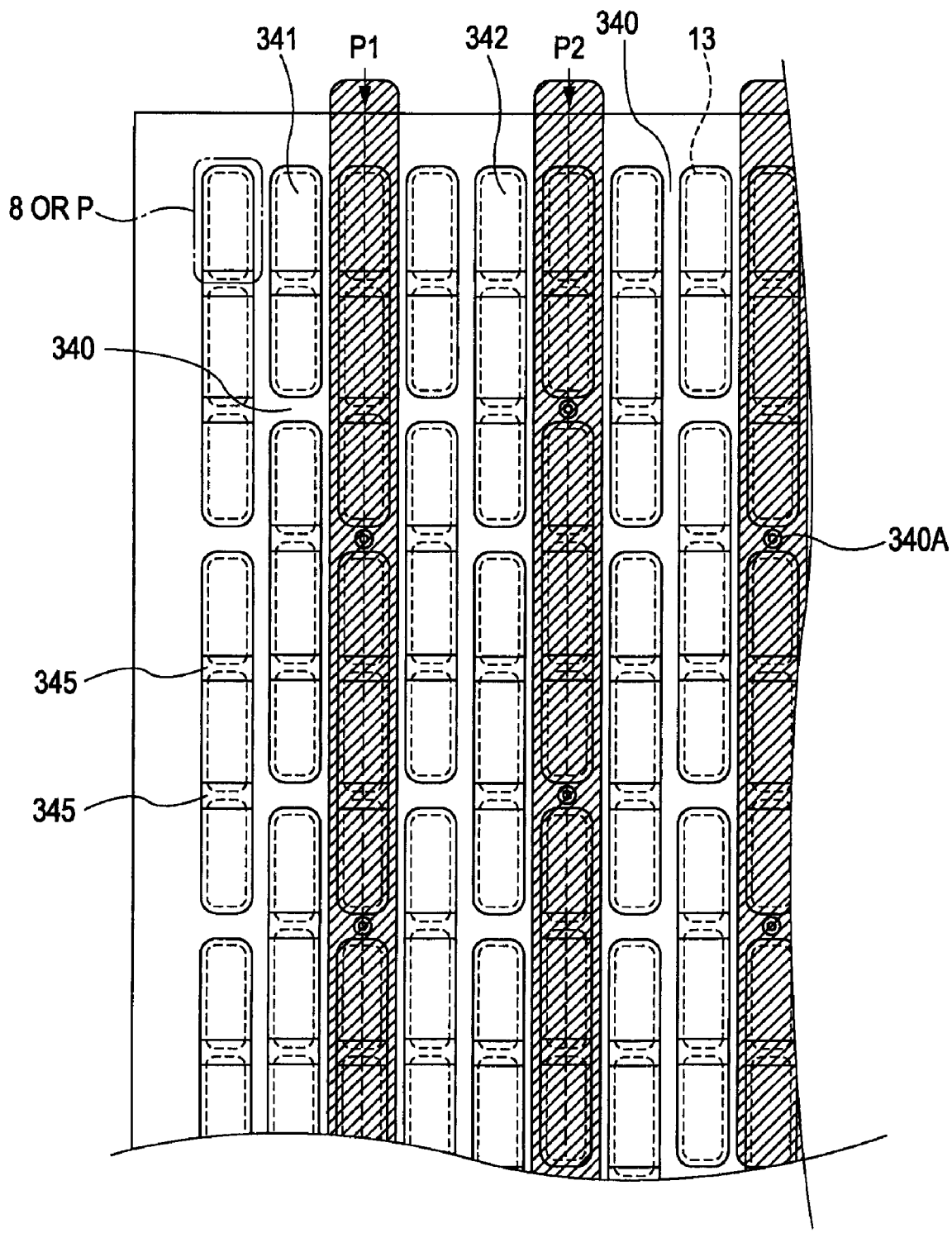
FIG. 3 is an enlarged plan view (illustrating a state after forming a light-emitting function layer) illustrating a part of an image display area of the organic EL device shown in FIG. 1.
Figure 4:
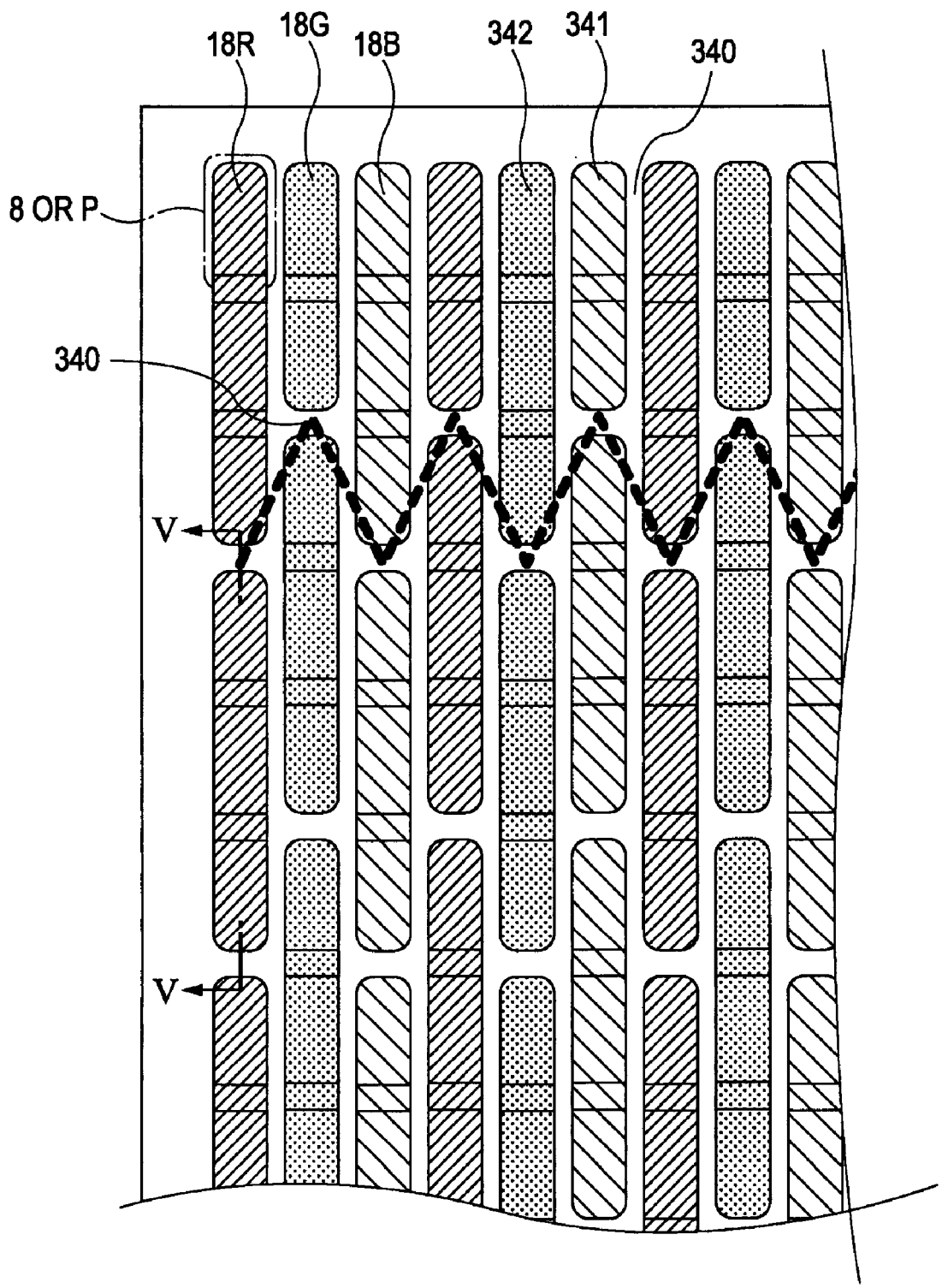
FIG. 4 is an enlarged plan view (illustrating a state before forming a light-emitting function layer) illustrating a part of an image display area of the organic EL device shown in FIG. 1.
Figure 5:
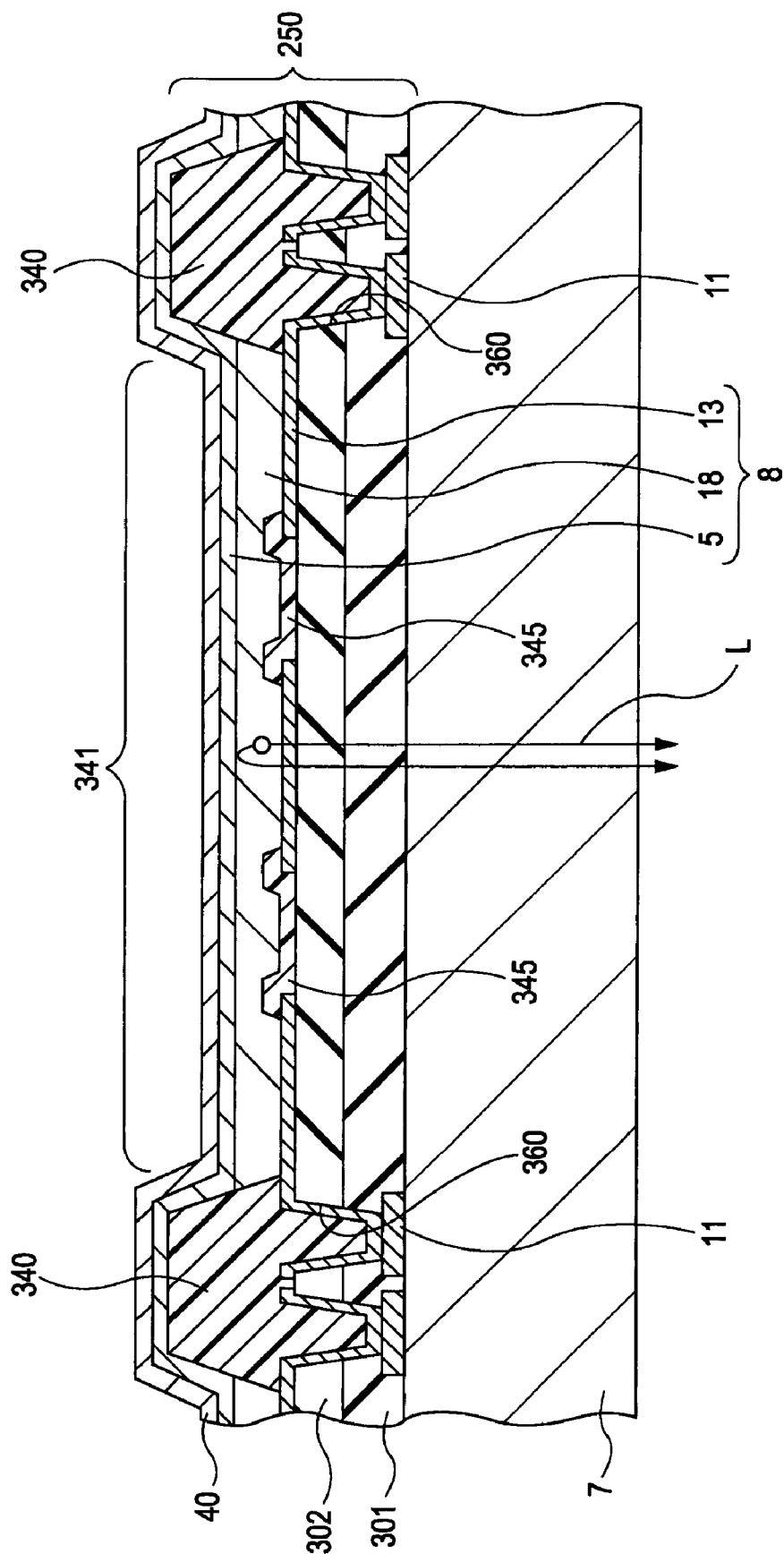
FIG. 5 is a sectional view taken along line VX1-VX1 of FIG. 4.

The organic EL device having the above-mentioned basic configuration has a detailed structure shown in FIGS. 3 to 5.

FIGS. 3 and 4 are both enlarged plan views illustrating a part of the image display area 7a of the organic EL device, where the former shows a state before forming a light-emitting function layer 18 and the latter shows a state after forming the light-emitting function layer 18. The pixel electrodes 13 (indicated by a broken line in the drawing) are shown in FIG. 3, but are not shown in FIG. 4 for the purpose of avoiding the complication.

As shown in FIGS. 3 and 4, the organic EL device includes partition wall layers 340 and openings 341 and openings 342 formed in an approximately elliptical shape by the partition wall layers.

The partition wall layer 340 forms a part of a stacked structure 250 as shown in FIG. 5 and is formed as an upper layer of the pixel electrode 13 to bury a contact hole 360. The partition wall layer 340 is preferably formed of an insulating transparent resin material particularly having a liquid repellency property. More specifically, examples of the material can include fluorine resin, acryl resin, epoxy resin, and polyimide.

When the partition wall layer 340 is formed of such various resin materials, a base layer thereof is preferably formed of an inorganic material such as $SiO_2$ (in this case, the partition wall layer 340 has a stacked structure of an inorganic material in the lower layer and an organic material in the upper layer). Accordingly, when the pixel electrode 13 is formed of ITO as described later, it is possible to enhance the close adhesion between the pixel electrode 13 and the partition wall layer 340.

It can be said that the opening 341 and the opening 342 are spaces surrounded with the partition wall layers 340 (more accurately, the sidewalls thereof) as shown in FIGS. 3 to 5. The bottom surface of the opening 341 or the opening 342 is flush with the surface of the pixel electrode 13. The light-emitting function layer 18, the counter electrode 5, and the barrier layer 40 are included in the opening 341 or the opening 342 (see FIG. 5).

First, as shown in FIG. 3 or 4, the opening 341 has an elliptical shape having a relatively small length in the vertical direction of the drawing. The opening 342 has an elliptical shape having a relatively large length in the same direction. The "elliptical shape" is used not to indicate an ellipse but a shape (more specifically, the diameter portions of two semi-circles are connected to the short sides) of a rectangle) obtained by connecting a rectangle and two semi-circles.

To correspond to the difference in shape, the opening 341 receives two pixel electrodes 13 arranged in the vertical direction in the drawing and the opening 342 receives three pixel electrodes 13 arranged in the same direction as shown in FIG. 3. The shape of each pixel electrode 13 in a plan view is substantially rectangular.

The pixel electrodes 13 are physically isolated from each other and are not electrically connected (see FIG. 5). As shown in FIGS. 3 to 5, electrode-dividing layers 345 formed of $SiO_2$ or SiN are formed between the pixel electrodes 13 in all the openings 341 or all the openings 342. Accordingly, one unit of the pixel electrode 13 can be grasped as "one electrode having a rectangular shape." Accordingly, one unit of the organic EL element 8 (or the unit circuit P) is determined on the basis of one unit of the pixel electrode 13 (see a portion surrounded with a dot-chained line denoted by reference numeral and sign "8" and "P", which surrounds the left-most column and upper-most pixel electrode in FIG. 3).

Paying attention to the arrangement of the pixel electrodes 13 in FIG. 3, the pixel electrodes 13 can be said to be arranged in a matrix.

As shown in FIG. 5, the pixel electrode 13 is electrically connected to a circuit element film 11 forming a part of the stacked structure 250 through the contact hole 360. The circuit element film 11 includes the first transistor 68 and the second transistor 9 included in the unit circuit P. Although it is simplified in the drawing, the circuit element film 11 includes a semiconductor layer forming the transistors, a gate insulating film, a gate metal or an electrode film forming the capacitor element 69 (which is not shown), and other metal films. The contact hole 360 are formed to penetrate first and second interlayer insulating films 301 and 302 forming a part of the stacked structure 250.

With the above-mentioned configuration, the pixel electrode 13 can apply current supplied from the current supply line 113 through the second transistor 9 to the light-emitting function layer 18.

The pixel electrode 13 is formed of a transparent conductive material such as ITO (Indium Tin Oxide).

The "opening" will be described again.

The openings 341 and the openings 342 are arranged in a predetermined rule as shown in FIGS. 3 and 4.

First, the openings 341 are disposed at the uppermost in the drawing in the second, fourth, sixth, . . . columns sequentially from the left in FIG. 3. The openings 342, 342, 342, . . . are sequentially arranged downward therefrom. The openings 342 are disposed at the uppermost in the drawing in the first, third, fifth, . . . columns sequentially from the left in FIG. 3 and the openings 342, 342, 342, . . . are sequentially arranged downward therefrom (in this case, the columns include only the columns 342).

With this arrangement, the positions of the partition wall layers 340 between the openings 341 and 342 and the openings 342 and 342 in the vertical direction in the drawing form a zigzag shape in the direction (the horizontal direction in the drawing) in which the columns are arranged as indicated by a bold broken line in FIG. 4. That is, in the first embodiment, the arrangement pattern of the partition wall layers 340 along a certain column is different from that in another column. This point will be described again later with reference to FIG. 6.

The partition wall layers 340 correspond to the "division portions" in the claims.

The openings 341 or the openings 342 having the above-mentioned arrangement belong to one of a first column group including the first, fourth, sixth, ... columns from the leftmost in the drawing, a second column group including the second, fifth, seventh, ... columns, and a third column group including the third, sixth, ninth, ... columns as shown in FIG. 4.

The first column group is a group in which the openings 341 or the openings 342 belonging thereto include a light-emitting function layer 18R formed of an organic EL material emitting red light. Similarly, the second column group and the third column group are a group in which the openings include a light-emitting function layer 18G formed of an organic EL material emitting green light and a group in which the openings include a light-emitting function layer 18B formed of an organic EL material emitting blue light, respectively. In the following description, reference numeral "18" is used to indicate reference numerals "18R", "18G", and "18B" in a bundle.

Details thereof are as follows. That is, in the first embodiment, the light-emitting function layers 18 are assigned to the openings 341 or the openings 342 one by one as shown in FIGS. 4 and 5. In the first embodiment, the light-emitting function layers 18 are received in the spaces surrounded with the sidewalls of the partition wall layers 340.

Each light-emitting function layer 18 includes at least an organic light-emitting layer and the organic light-emitting layer is formed of an organic EL material emitting light by combination of electrons and holes with each other. In the first embodiment, examples of the organic EL material can include cyano polyphenylenevinylene corresponding to the emission of red light, polyphenylenevinylene corresponding to the emission of green light, and polyphenylenevinylene and polyalkylphenylene corresponding to the emission of blue light (these materials are only examples). The openings 341 and 342 including the light-emitting function layer 18R formed of the foremost material are included in the first column group, the openings 341 and 342 including the light-emitting function layer 18G formed of the next material are included in the second column group, and the openings 341 and 342 including the light-emitting function layer 18B formed of the last material are included in the third column group.

The following relation exists between the classification of the first, second, and third column groups and the arrangement of the openings 341 and 342.

First, as shown in FIG. 3, attention is paid to the third, sixth, ninth, ... columns from the left of the drawing, which constitute the third column group (portions hatched in the drawing).

In the third column, the openings 342, 342, 342, ... are arranged sequentially from the uppermost in the drawing. Accordingly, in view of the number of pixel electrodes 13, the partition wall layer 340A is disposed after three pixel electrodes 13 from the uppermost (see the black circle in the drawing) and the partition wall 340A is disposed after three more pixel electrodes 13, which is repeated.

In the sixth column, the opening 341 and the openings 342, 342, 342, ... are arranged sequentially from the uppermost in the drawing. Accordingly, in view of the number of pixel electrodes 13, the partition wall layer 340A is disposed after two pixel electrodes 13 from the uppermost, the partition wall 340A is disposed again after three more pixel electrodes 13, and the partition wall layer 340A is disposed every three pixel electrodes 13, which is repeated.

In the ninth column, as can be seen from the drawing, the arrangement is the same as the third column. Thereafter, the same is true in the 15-th, 21-th, 27-th, ... columns. The twelfth column has the same arrangement as the sixth column. Thereafter, the same is true in the 12-th, 18-th, 24-th, ... columns.

In brief, in the first embodiment, the arrangement patterns of the partition wall layers 340A located in the adjacent columns (for example, the third and sixth columns or the sixth and ninth columns) of the third column group are different from each other. As can be seen from FIGS. 3 and 4, this is true in the first column group and the second column group. The partition wall layers 340A correspond to the "division portions" in the claims (this is natural because the partition wall layer 340A is the very partition wall layer 340 and the partition wall layer 340 corresponds to the "division portions").

The organic EL device according to the first embodiment includes the above-mentioned elements, but various elements not mentioned above or elements mentioned above but supplementary will be described now.

First, the first and second interlayer insulating films 301 and 302 (hereinafter, also simply referred to as "insulating films 301 and 302") serve to prevent the shortcircuit between the conductive elements in the stacked structure 250 or to accomplish a very optimal arrangement in the stacked structure 250 of the conductive elements.

The insulating films 301 and 302 can be formed of various insulating materials with various thicknesses, but the thickness and material suitable for the positions and functions of the insulating layers in the stacked structure 250 is preferably selected. For example, the insulating films 301 and 302 are preferably formed of $SiO_2$, SiN, or SiON.

Alternatively, the second interlayer insulating film 302 may be formed of acryl resin, the top surface of which can be easily flat, so that the plural pixel electrodes 13 (see FIG. 4) using the second interlayer insulating film as a base layer are flush with each other.

The barrier layer 40 shown in FIG. 5 is formed on the counter electrode 5 so as to cover the entire surface of the element substrate 7. The barrier layer 40 has a function of preventing water or oxygen from penetrating the organic EL elements 8. In order to satisfactorily perform such a function, the barrier layer 40 is preferably formed of SiN, SiON, or $SiO_2$.

The counter electrode shown in FIG. 5 is formed on the light-emitting layers 18 to cover the entire surface of the element substrate 7. The counter electrode 5 has a rectangular shape (so-called beta shape not having any opening or any gap therein) in a plan view and the edge is electrically connected to the power supply line 201 shown in FIG. 1 (the connection is not shown).

The counter electrode 5 is formed of a material such as aluminum and silver having relatively high light-reflecting performance.

Each organic EL element 8 includes the counter electrode 5, the pixel electrode 13, and the light-emitting function layer 18 described above in detail.

With the above-mentioned structure, for example, when the pixel electrode 13 is set to a positive electrode, the counter electrode 5 is set to a negative electrode, and current flows across both electrodes, the current flows in the light-emitting function layer 18, whereby the light-emitting function layer 18 emits light. In this case, the light of red, green, and blue corresponding to the organic EL materials is emitted. A part of the light emitted from the light-emitting function layer 18 travels to the outside of the organic EL device through the element substrate 7, and the other travels to the counter electrode 5, is reflected from the counter electrode 5, and then travels to the outside of the organic EL device (see reference sign "L" in FIG. 5). Accordingly, the organic EL device according to the first embodiment is called bottom emission type, since the light L travels to the element substrate 7.

The operations and advantages of the organic EL device will be described now.

(1) The organic EL device according to the first embodiment accomplishes the improvement in facilitation of manufacture. In the first embodiment, when the light-emitting function layer 18 is formed in one opening 341 or 342, the light-emitting function layer 18 for two or three pixel electrodes 13 included in the opening 341 or 342 is formed at a time.

In the first embodiment, since the light-emitting function layer 18 is divided into an appropriate number of portions by the partition wall layers 340 (see the partition wall layer 340A in FIG. 3), it is not caused that a problem at a position in the light-emitting function layer 18 influences the "entire" pixels. Here, the "problem" means that the light-emitting function layer "18G" is mixed into a position where the light-emitting function layer 18R should be disposed or that the ink is condensed on minute particles permeating any column. According to the first embodiment, the facilitation of manufacture is guaranteed from such a point of view.

(2) According to the first embodiment, it is possible to improve the facilitation of manufacture and to prevent the occurrence of unevenness in brightness. This is for the following reasons.

Figure 6:
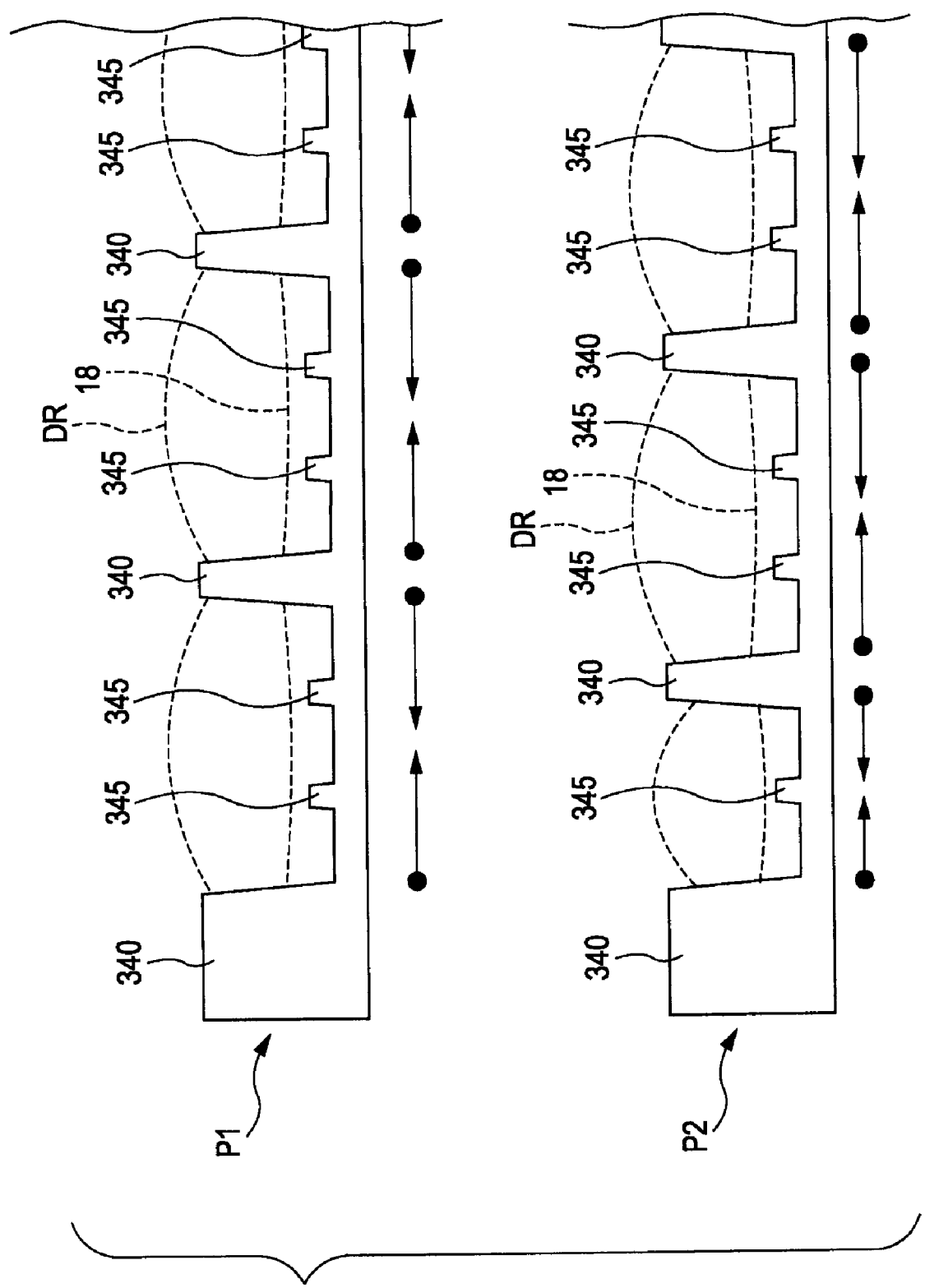
FIG. 6 is a diagram schematically illustrating arrangement patterns of partition wall layers in a column denoted by reference sign "P1" in FIG. 3 and a column denoted by reference sign "P2."

In the first embodiment, as described above, the arrangement pattern of the partition wall layers 340 in the vertical direction or in a certain column in FIG. 3 or 4 is different from that in another column. For example, as schematically shown in FIG. 6, in the arrangement pattern of the partition wall layers 340 in the column denoted by reference sign "P1" in FIG. 3, the partition wall layer 340, two electrode-dividing layers 345, the partition wall 340, two electrode-dividing layers 345, and the partition wall layer 340 are arranged sequentially from the left, which is repeated. In the arrangement pattern of the partition wall layers 340 in the column denoted by reference sign "P2" in FIG. 3, the partition wall layer 340, one electrode-dividing layer 345, the partition wall 340, two electrode-dividing layers 345, and the partition wall layer 340 are arranged sequentially from the left, which is repeated.

The drying states of the liquid droplets DR for the light-emitting function layers 18 are different from each other at the upper end and the lower end in FIG. 6. That is, in one of the upper end and the lower end in FIG. 6, the spaces surrounded with the sidewalls of the partition wall layer 340 (that is, the openings 341 or 342) are supplied with the liquid droplets DR and the light-emitting function layer 18 can be formed by drying the liquid droplets DR. In addition, since the upper end and the lower end in FIG. 6 correspond to the column P1 and the column P2 in FIG. 3, that is, belongs to the third column group, the supply and the dryness of the liquid droplets DR are performed substantially at the same time.

The dryness of the liquid droplets DR is started from the ends of the partition wall layers 340 (in this case, may be referred to as the partition wall layers 340A), that is, the position of the "division portions", and the vicinities thereof. "Circle-attached arrows" shown in FIG. 6 show the drying state, where the "circle" indicates the drying start point and the end of the arrow indicates the drying end point.

Accordingly, it can be seen that the drying start points are deviated from each other and the drying end points are deviated from each other in the upper end and the lower end in FIG. 6. That is, the upper end and the lower end in FIG. 6 are different in the drying state of the liquid droplets DT. This is because the arrangement patterns of the partition wall layers 340 are different from each other.

Accordingly, in the first embodiment, like unevenness in dryness of the liquid droplets DR does not occur in the entire surface of the element substrate 7. For example, when it is assumed that the partition wall layers 340A in FIG. 3 are not disposed but a groove having a "stripe shape" is disposed over the entire length of the element substrate 7, the drying end points can be arranged on a straight line crossing the element substrate 7. As a result, an event that the condensation of effective components such as the organic EL material is concentrated on a specific area may occur. In this case, the unevenness in brightness can be more visible in the image display using the entire organic EL elements 8.

Such a disadvantage does not occur in the first embodiment.

The above description is based on the column P1 and the column P2 belonging to the third column group, and the same is true in the first column group and the second column group.

Consequently, according to the first embodiment, it is possible to prevent the occurrence of unevenness in brightness.

Second Embodiment

An organic EL device according to a second embodiment of the invention will be described now with reference to FIGS. 7 to 11.

The basic structure of the organic EL device according to the second embodiment is substantially equal to that of the organic EL device according to the first embodiment. Accordingly, the reference numerals and signs of the elements common to both embodiments are used in common and description thereof is omitted or simplified.

As can be seen from the comparison of FIGS. 7 and 3, FIGS. 8 and 4, or FIGS. 10 and 5, the organic EL device according to the second embodiment has many common points to the first embodiment. The representative common points are as follows.

(1) In the second embodiment, the partition wall layers 340 are provided to form the "openings." The "openings" also have an "elliptical shape."

(2) The shape of each pixel electrode 13 is completely equal to that of the first embodiment. The pixel electrodes are similarly arranged in a matrix (only the pixel electrodes 13 located in the leftmost columns and the uppermost ends thereof are shown in FIG. 7 for the purpose of avoiding the complication).

Figure 8:
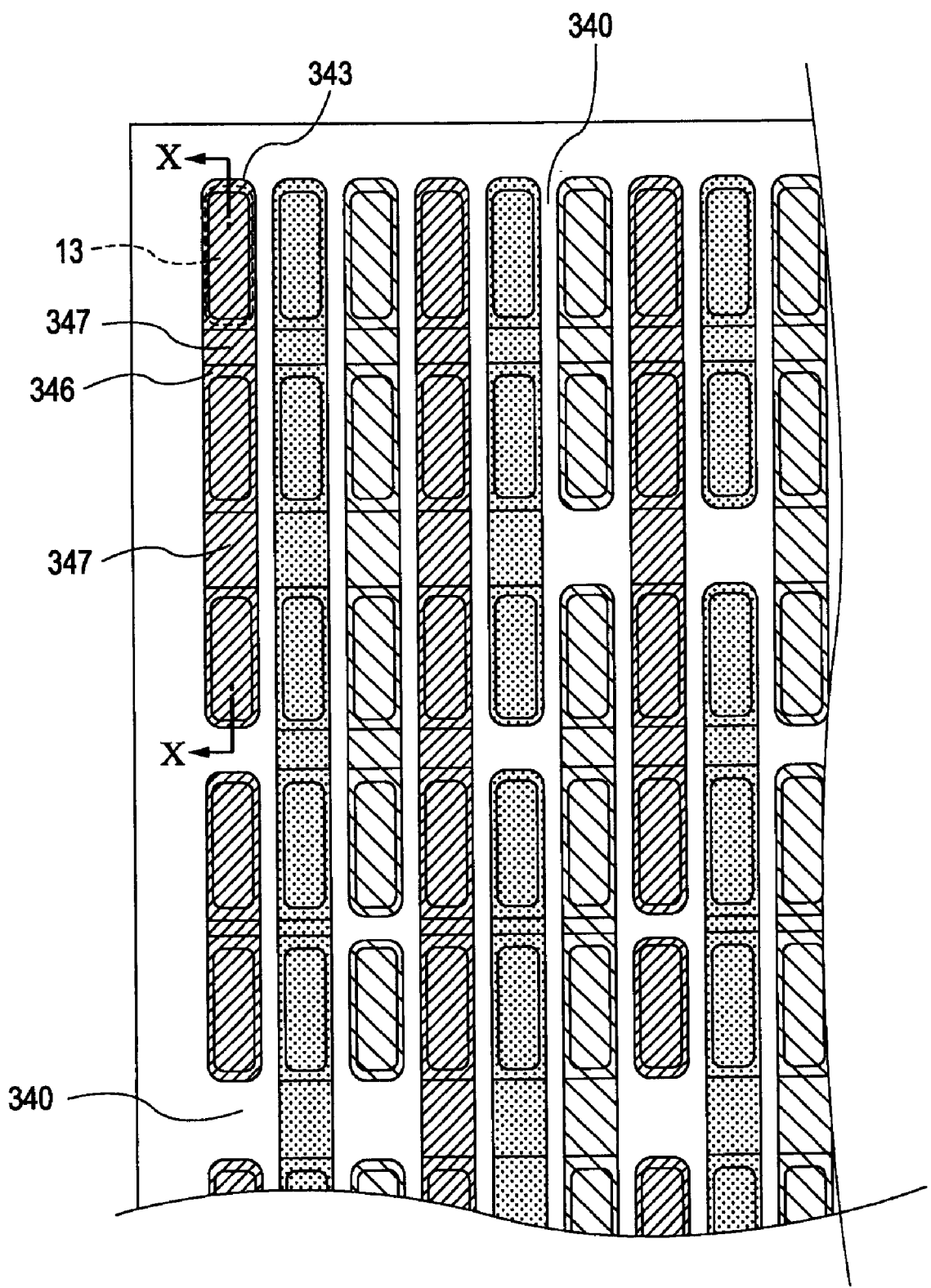
FIG. 8 is a plan view illustrating the same state as shown in FIG. 4 according to the second embodiment of the invention.

(3) In the second embodiment, the first, second, and third column groups are classified as described above (see the comparison of FIGS. 8 and 4). That is, as shown in FIG. 8, the "openings" belong to any of the first column group including the first, fourth, sixth, . . . columns from the left, the second column group including the second, fifth, seventh, . . . columns, and the third column group including the third, sixth, ninth, . . . columns. Regarding the definition of the column groups, similarly to the first embodiment, the column groups correspond to the light-emitting function layers 18R, 18G, and 18B, respectively.

However, the second embodiment is different from the first embodiment, in the arrangement of the "openings" and the existence of the electrode-dividing bases 347 instead of the electrode-dividing layers 345.

Figure 7:
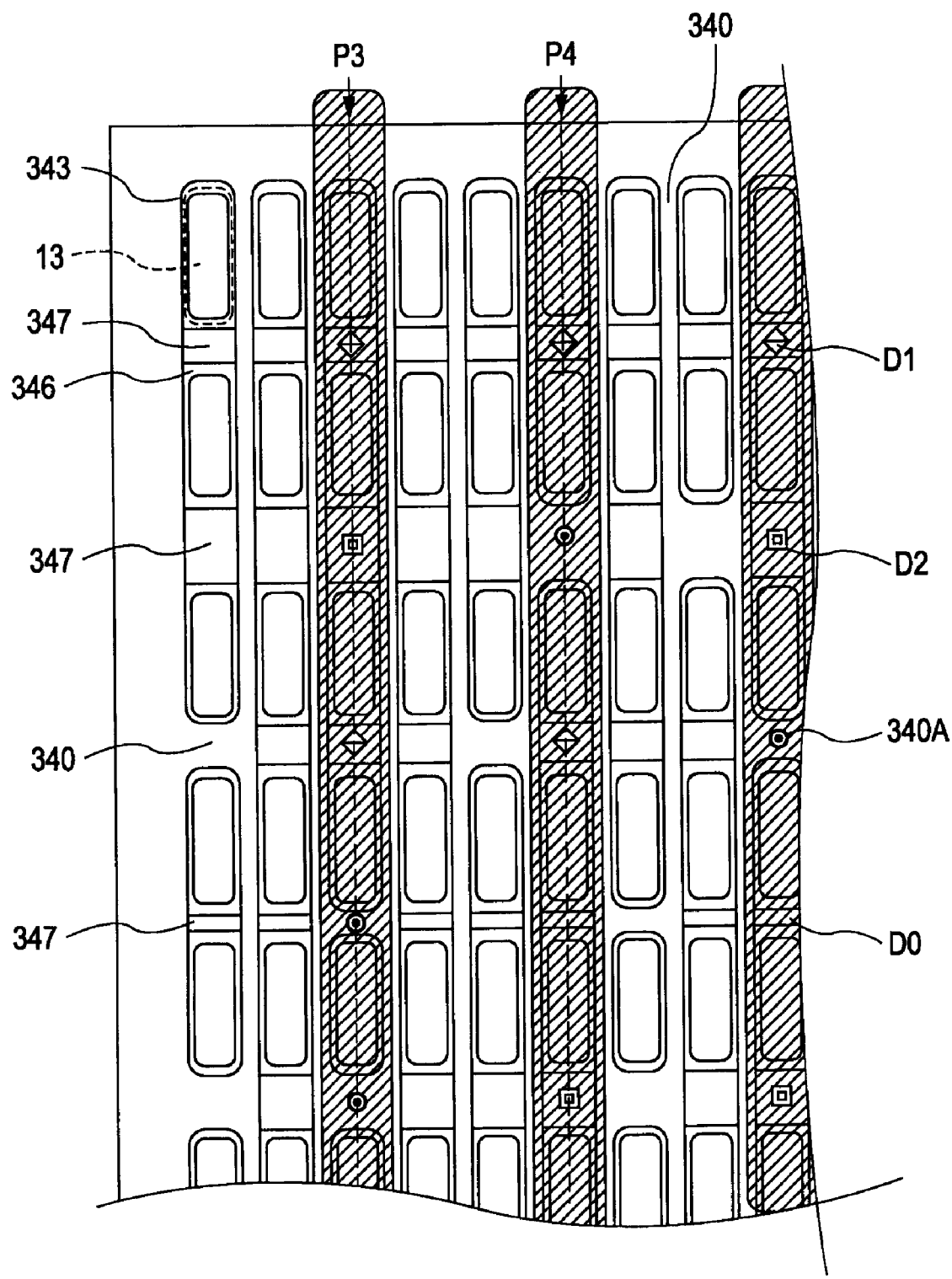
FIG. 7 is a plan view illustrating the same state as shown in FIG. 3 according to a second embodiment of the invention.

In the second embodiment, the "openings" have different areas to such an extent that the respective areas can be said to be all different as shown in FIGS. 7 and 8. For example, the opening 343 located in the leftmost column and the uppermost end in the drawings has a length for receiving three pixel electrodes 13, but the "opening" adjacent thereto on the right side thereof has a length for receiving at least six pixel electrodes 13, that is, a length that cannot be shown entirely. The "opening" adjacent thereto on the further right side has a length for receiving four pixel electrodes 13.

In this way, the "openings" having various sizes are disposed in the second embodiment. However, all the "openings" do not have different areas, respectively. For example, the "opening" located in the uppermost of the column apart by four columns from the opening 343 receives three pixel electrodes 13, similarly to the opening 343.

Accordingly, in the second embodiment, all the "openings" are not denoted by the reference numerals or signs. In the following description of the second embodiment, only the "opening" located in the uppermost of the leftmost column in FIGS. 7 and 8 is denoted by "343."

In the second embodiment, the "openings" having various areas are arranged without complying with a particular regulation. For example, the openings receiving two pixel electrodes 13 are arranged below the opening 343 in the drawing and the opening receiving three or more pixel electrodes 13 are arranged below the opening (which receives three pixel electrodes 13 similarly to the opening 343) located in the rightmost end in FIGS. 7 and 8.

In brief, the openings having random sizes or areas are arranged randomly.

Figure 10:
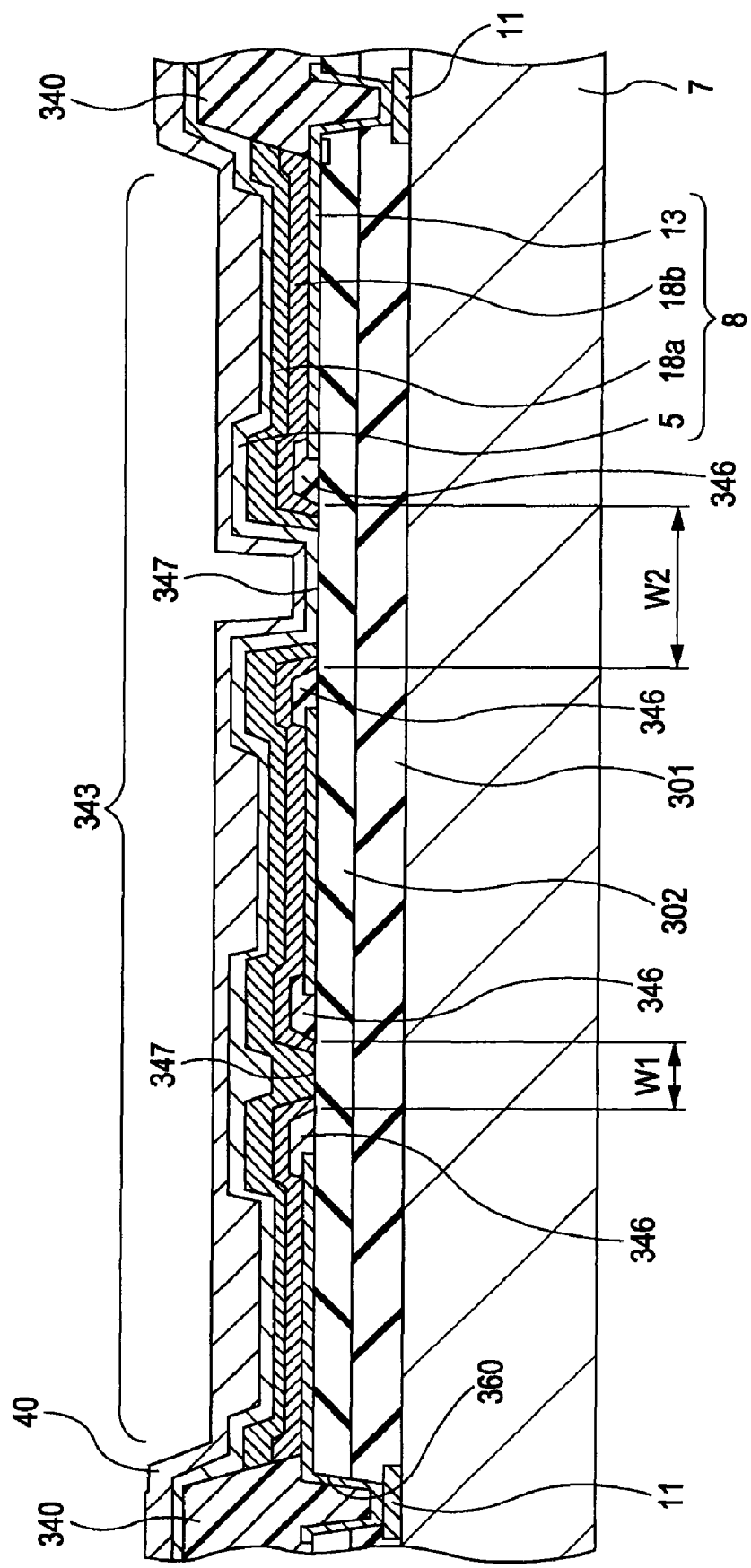
FIG. 10 is a sectional view taken along line XX2-XX2 of FIG. 8.

In the second embodiment, the electrode-dividing base 347 which is not disposed in the first embodiment is disposed. The electrode dividing base 347 is a part of the second interlayer insulating film 302 constituting the stacked structure 250, as shown in FIG. 10.

An example of the opening 343 will be described in more detail now.

As described above or as shown in FIGS. 9 and 10, the opening 343 receives three pixel electrodes 13. Three liquid affinity layers 346 are formed to correspond to three pixel electrodes 13 and to cover the edges thereof. The liquid affinity layer 346 corresponds to the electrode-dividing layer 345 in the first embodiment and is formed of $SiO_2$ or SiN like the electrode-dividing layer 345. However, the liquid affinity layer 346 is not located between the pixel electrodes 13 and does not have the function of dividing the pixel electrodes 13.

The liquid affinity layer 346 is subjected to a liquid affinity property giving process such as an oxygen plasma process.

Although not described in the first embodiment, the electrode-dividing layers 345 may be subjected to the liquid affinity property giving process like the liquid affinity layer 346.

The electrode-dividing base 347 corresponds to an area in which the pixel electrode 13 is not formed and an area in which the liquid affinity layer 346 is not formed. That is, a portion in which the pixel electrode 13 and the liquid affinity layer 346 are not formed and the surface of the second interlayer insulating film 302 as the base surface is exposed serves as the electrode-dividing base 347.

The electrode-dividing base 347 is subjected to a liquid repellency property giving process such as a $CF_4$ plasma process. In order to perform such a process, the second interlayer insulating film 302 is preferably formed of fluorine resin, acryl resin, epoxy resin, or polyimide like the partition wall layer 340.

In addition, the light-emitting function layer 18 in the second embodiment is different from that of the first embodiment as described below. That is, the light-emitting function layer 18 in the first embodiment includes at least the organic light-emitting layer, but the light-emitting function layer includes at least an organic light-emitting layer 18a and a hole injection layer 18b as shown in FIG. 10. The hole injection layer 18b has a function of injecting holes from the pixel electrode 13 as the positive electrode to the organic light-emitting layer 18a. The hole injection material constituting the hole injection layer 18b can include Baytron (registered trademark) made by Bayer.

Operations and advantages of the organic EL device according to the second embodiment will be described now.

In the second embodiment, similarly to the first embodiment, the partition wall layers 340 correspond to the "division portions" in the claims and the electrode-dividing bases 347 also correspond to the "division portions."

More specifically, similarly to the first embodiment, the "third column group" is exemplified as follows.

In the second embodiment, as shown in FIG. 7, the partition wall layer 340A is disposed similarly to the first embodiment. As shown in FIGS. 10 and 8, the partition wall layer 340A serves as a division portion dividing the entire light-emitting function layer 18, that is, both the organic light-emitting layer 18a and the hole injection layer 18b, from the light-emitting function layer 18 adjacent thereto.

In the second embodiment, the electrode-dividing base 347 has a function of dividing the light-emitting function layer 18. However, both of the organic light-emitting layer 18a and the hole injection layer 18b of the light-emitting function layer 18 are divided or only one is divided (both are not divided), depending on the length of the electrode-dividing base 347.

Figure 9:
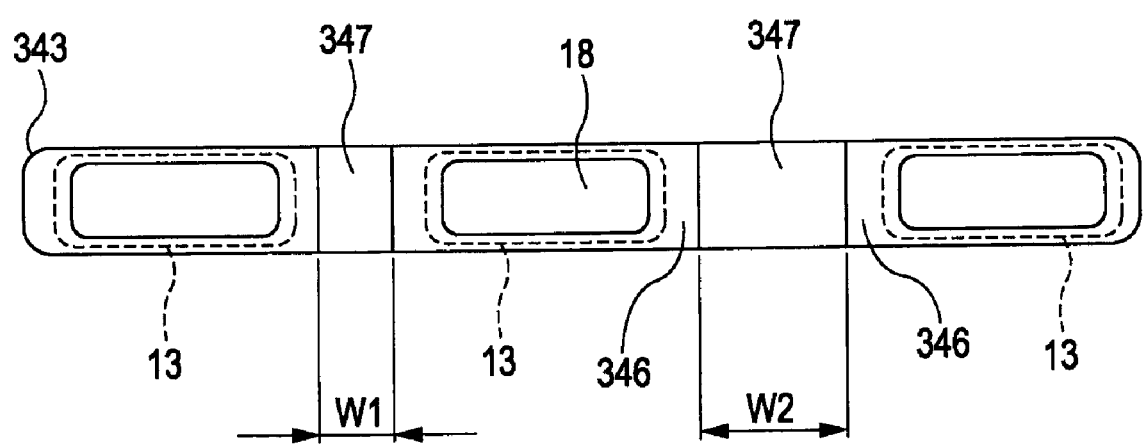
FIG. 9 is an enlarged plan view illustrating an opening "343" shown in FIG. 8.

That is, as shown in FIGS. 9 and 10, two electrode-dividing bases 347 are disposed in the opening 343, where the length of one is W1 and the length of the other is W2 (>W1). Here, by considering that the electrode-dividing bases 347 are subjected to the liquid repellency property giving process, the electrode-dividing base having the greater length makes two light-emitting function layers 18 in contact with the electrode-dividing base 347 more apart from each other.

more specifically, as shown in FIG. 10, the electrode-dividing base 347 having the length W2 has a function of dividing the hole injection layer 18b and the organic light-emitting layer 18a. Since the electrode-dividing base 347 has a relatively great length, the surface portion remains relatively wide even after dividing the hole injection layer 18b, thereby exhibiting liquid repellency performance enough to divide the organic light-emitting layer 18a. As shown in FIG. 10, the electrode-dividing base 347 having the length W1 divides the hole injection layer 18b but does not divide the organic light-emitting layer 18a. Since the electrode-dividing base 347 has a relatively small length, the surface portion is narrowed even after dividing the hole injection layer 18b, thereby not exhibiting the liquid repellency performance enough to divide the organic light-emitting layer 18a.

In view of the above description, both the electrode-dividing bases 347 (whether the length is W1 or W2) and the partition wall layers 340 correspond to the "second division portions" in the claims.

The electrode-dividing base 347 having the length W2 and the partition wall layer 340 correspond to the "first division portions."

Figure 11:
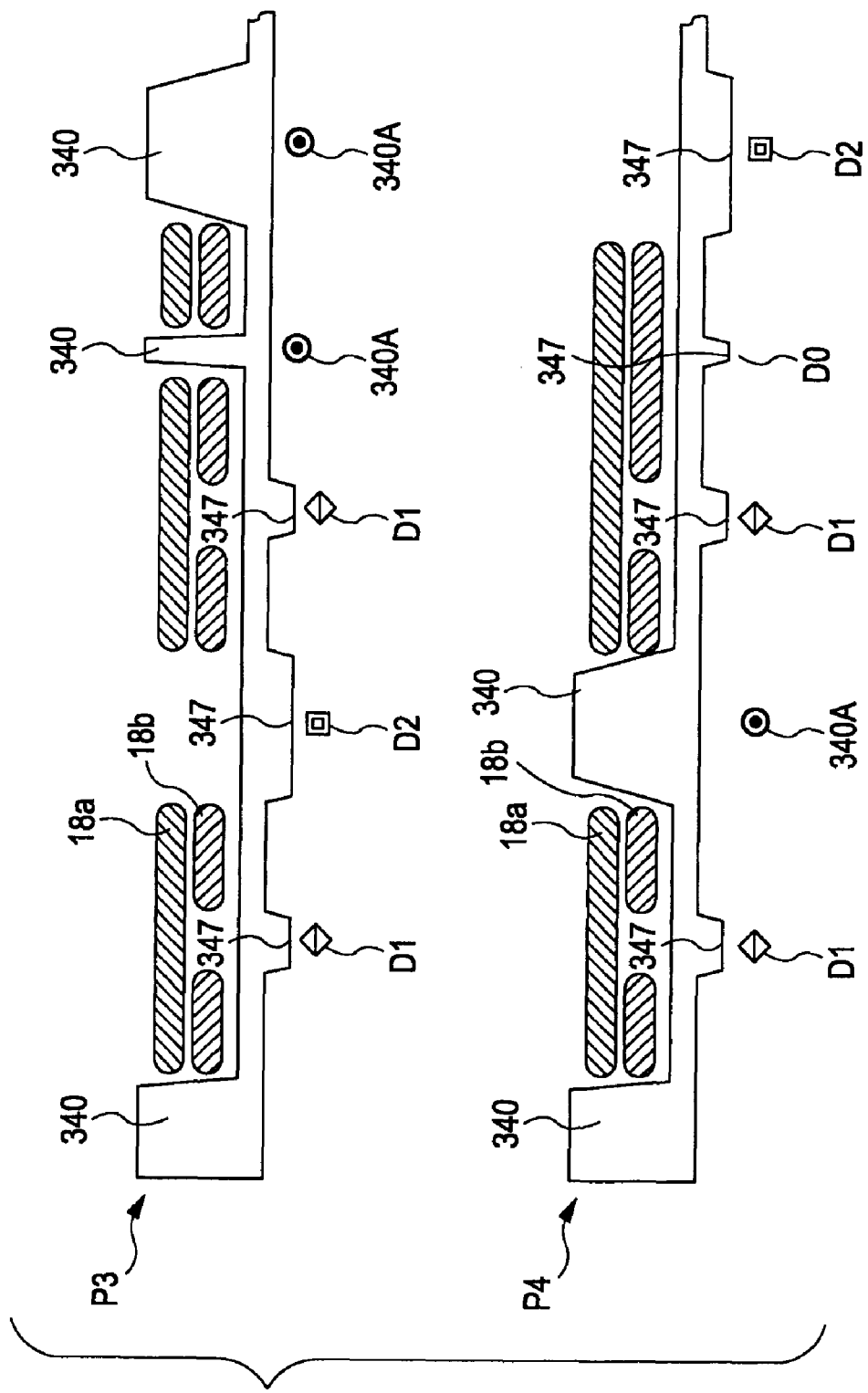
FIG. 11 is a diagram schematically illustrating arrangement patterns of partition wall layers and electrode dividing bases in a column denoted by reference sign "P3" in FIG. 7 and a column denoted by reference sign "P4."

The above definition is described again now with reference to FIG. 11.

FIG. 11 is a diagram illustrating the same state as shown in FIG. 6 in the first embodiment. That is, the upper portion of FIG. 11 schematically illustrates the arrangement pattern of the partition wall layers 340A and the electrode-division bases 347 in the column denoted by reference sign "P3" in FIG. 7 and the lower portion thereof schematically illustrates the arrangement pattern of the partition wall layers 340A and the electrode-dividing bases 347 in the column denoted by reference sign "P4" in FIG. 7.

In the former (column P3), [0] the partition wall layer 340, [1] the electrode-dividing base 347 having a middle length, [2] the electrode-dividing base 347 having a great length, [3] the electrode-dividing base 347 having a middle length, [4] the partition wall layer 340A (having a "small" length), and [5] the partition wall 340A (having a "great" length) are arranged sequentially from the left.

In the latter (column P4), [0] the partition wall layer 340, [1] the electrode-dividing base 347 having a middle length, [2] the partition wall 340A (having a "great" length), [3] the electrode-dividing base 347 having a middle length, [4] the electrode-dividing base 347 having a small length, [5] the electrode-dividing base 347 having a great length are arranged sequentially from the left.

In this case, the "great" length corresponds to the length W2 shown in FIGS. 9 and 10 and thus the electrode-dividing base 347 having the length divides the entire light-emitting function layer 18. In FIG. 11, the reference sign D1 represents it and is also shown in FIG. 7. The "middle" length corresponds to the length W1 shown in FIGS. 9 and 10 and thus the electrode-dividing base 347 having the length divides only the hole injection layer 18b of the light-emitting function layer 18. In FIG. 11, the reference sign D2 represents it and is also shown in FIG. 7.

The electrode-dividing base 347 having a "small" length is mainly used to divide the pixel electrodes 13 and does not divide the light-emitting function layer 18 (reference sign D0 (only the sign) is attached in FIGS. 11 and 7). Accordingly, the electrode-dividing base having a small length does not correspond to the "first division portion" and the "second division portion" in the claims and does not correspond to the "division portion."

The partition wall layer 340 divides the entire light-emitting function layer 18, regardless of the length.

As a result, the division state of the light-emitting function layer 18 or the organic light-emitting layer 18a and the hole injection layer 18b of the light-emitting function layer is as shown in FIG. 11.

In the second embodiment, as described above, the "openings" having random lengths are arranged randomly, but the constant regulation observed in the first embodiment is also observed in the second embodiment.

First, from the rough viewpoint, the arrangement pattern of the partition wall layers 340 and the electrode-dividing bases 347 in a certain column is different from that in another column. This is apparent from FIGS. 7 to 11.

Second, more specifically, the arrangement patterns of the partition wall layers 340 and the electrode-dividing bases 347 located in the columns (for example, the fourth and seventh columns as columns P3 and P4 in FIGS. 7 and 11) adjacent to each other in a certain column group are different from each other.

When the "division portions" in the claims include different types such as the partition wall layers 340 and the electrode-dividing bases 347 as described in the second embodiment and the arrangement pattern in a certain column is different from that in another column, the "difference" includes a difference in type. For example, in FIG. 11, the electrode-dividing base 347 having a great length is disposed in the upper portion but the partition wall layer 340 having a great length is disposed in the lower portion. In this case, both are functionally equal to each other in dividing the entire light-emitting function layer 18 but are different from each other in arrangement pattern. In this case, the function of dividing the light-emitting function layer 18 may be different between both (for example, since the division using the partition wall layer 340 is sure but the division using the electrode-dividing base 347 is not so, both may be different from each other in drying state).

On the basis of such a situation, it is analyzed that the "arrangement patterns of the division portions" are "different." The same is true when the arrangement patterns in the adjacent columns are "different" from each other.

As can be clearly seen from the above description, substantially the same advantages (that is, improvement in facilitation of manufacture and prevention the occurrence of unevenness in brightness) as the first embodiment are obtained in the second embodiment.

The following specific advantages are also obtained in the second embodiment.

(1) Since the organic EL device according to the second embodiment has a structure in which the "openings" have random sizes and are arranged randomly, the degree of difference between the drying start points and the drying end points on the entire surface of the element substrate 7 is greater than that of the first embodiment. That is, even when the condensation of the effective components such as the organic EL material occurs, the condensation is dispersed randomly on the entire surface of the element substrate 7. Accordingly, in the second embodiment, it is possible to more effectively accomplish the prevention of the occurrence of unevenness in brightness.

(2) In the second embodiment, as described above, the electrode-dividing bases 347 correspond to the "division portions", in addition to the partition wall layers 340 and the division state of the light-emitting function layer 18 varies depending on the lengths of the electrode-dividing bases 347. Accordingly, in the second embodiment, as can be seen from FIG. 11, the division state of the organic light-emitting layer 18a and the division state of the hole injection layer 18b are different from each other. That is, the drying state in the process of drying the organic light-emitting layer 18a is different from that of the hole injection layer 18b. Accordingly, the advantages of the first embodiment can be repeatedly accomplished in the direction perpendicular to the surface of the element substrate 7. Accordingly, it is possible to more effectively accomplish the prevention of the occurrence of unevenness in brightness.

(3) In the second embodiment, since the electrode-dividing bases 347 can perform the function of the "division portions", the size of the opening can be greater than that in the first embodiment (for example, the "opening" including at least six pixel electrodes 13 can exist as described above). Accordingly, it is possible to more effectively accomplish the improvement in facilitation of manufacture by forming the light-emitting function layer 18 for the plural pixel electrodes 13 at a time. In this case, when the arrangement of the electrode-dividing bases 347 (that is, the electrode-dividing bases 347 not having the function of dividing the light-emitting function layer 18) having a small length and denoted by reference sign D0 in FIGS. 7 and 11 is effectively set, it is possible to more effectively accomplish the above-mentioned advantage.

Although the embodiments of the invention have been described, the light emitting device according to the invention is not limited to the embodiments, but may be modified in various forms as described below.

(1) In the above-mentioned embodiments, the light-emitting function layer 18 includes at least the organic light-emitting layer (the first embodiment) and includes the organic light-emitting layer 18a and the hole injection layer 18b (the second embodiment), but the invention is not limited to the embodiments. The light-emitting function layer 18 may include all or a part of an electron blocking layer, a hole transport layer, an electron transport layer, an electron injection layer, and a hole blocking layer as other layers.

(2) In the second embodiment, the arrangement pattern of the partition wall layers 340 and the electrode-dividing bases 347 in a certain column is different from that in another column. However, for example, as seen from FIG. 8, there exists the constant regularity in the horizontal direction that the partition wall layers 340 or the electrode-dividing bases 347 arranged horizontally adjacent to the electrode-dividing bases 347 having a "great" length have a "great" length and the partition wall layers 340 or the electrode-dividing bases 347 arranged horizontally adjacent to the electrode-dividing bases 347 having a "middle" length have a "middle" length. The invention is not limited to the regularity. That is, in some cases, the regularity may be broken (that is, the lengths may be random).

(3) The organic EL device according to the above-mentioned embodiments is of a bottom emission type, but the invention is not limited to the bottom emission type. The invention may be applied to any of a top emission type and a dual emission type.

When the invention is applied to the top emission type, a reflecting layer for allowing the light emitted from the light-emitting function layer 18 to travel in the opposite direction of the element substrate 7 is required. For example, on the premise of FIG. 5, the reflecting layer may be formed above the first interlayer insulating film 301 and below the second interlayer insulating layer 302 to correspond to the forming areas of the pixel electrodes 13. In this case, the element substrate 7 is preferably formed of an opaque material such as ceramics or metal (in the bottom emission type, the element substrate 7 should be formed of a transparent material) and the counter electrode 5 is preferably formed of a transparent material.

APPLICATIONS

Figure 12:
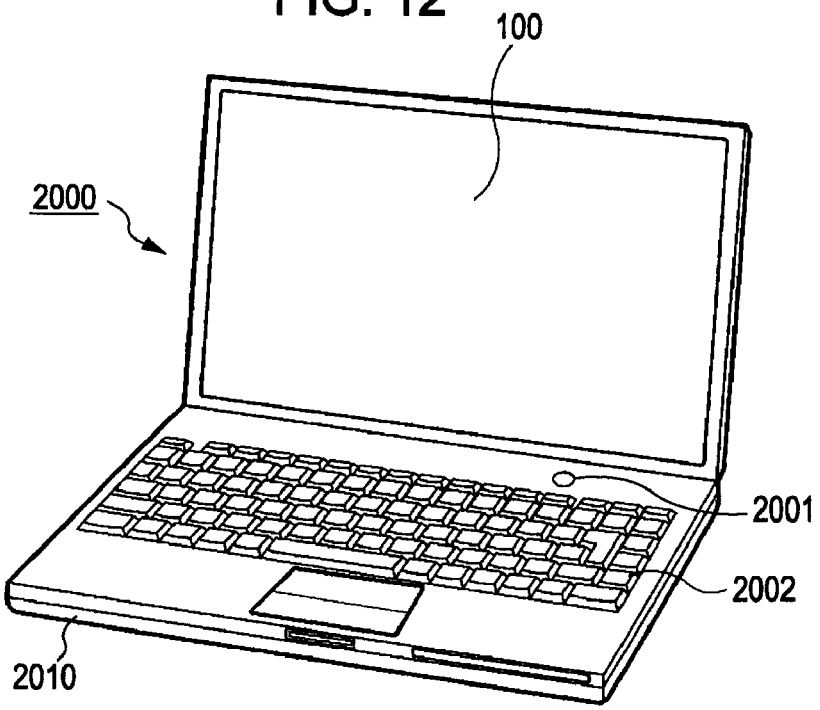
FIG. 12 is a perspective view illustrating an electronic apparatus including the organic EL device according to the embodiments of the invention.

An electronic apparatus having the organic EL device according to the embodiments of the invention will be described now. FIG. 12 is a perspective view illustrating a configuration of a mobile personal computer using the organic EL device according to the embodiments as an image display device. The personal computer 2000 includes an organic EL device as a display device and a body unit 2010. The body unit 2010 is provided with a power switch 2001 and a keyboard 2002.

Figure 13:
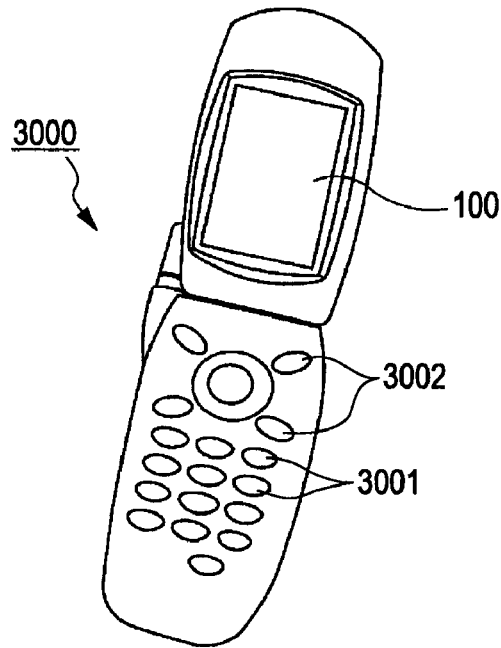
FIG. 13 is a perspective view illustrating another electronic apparatus including the organic EL device according to the embodiments of the invention.

A mobile phone employing the organic EL device according to the embodiments is shown in FIG. 13. The mobile phone 3000 includes plural operation buttons 3001, scroll buttons 3002, and an organic EL device 1 as a display device. The picture displayed on the organic EL device is scrolled by operating the scroll buttons 3002.

Figure 14:
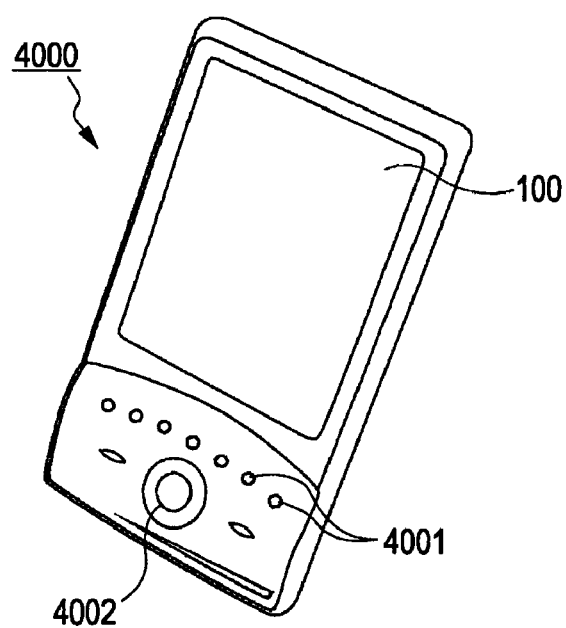
FIG. 14 is a perspective view illustrating another electronic apparatus including the organic EL device according to the embodiments of the invention.

A personal digital assistant (PDA) employing the organic EL device according to the embodiments is shown in FIG. 14. The PDA 4000 includes plural operation buttons 4001, a power switch 4002, and an organic EL device as a display device. A variety of information such as an address book and a schedule book is displayed on the organic EL device by operating the power switch 4002.

Examples of the electronic apparatus including the organic EL device according to the above-mentioned embodiments can include a digital still camera, a television, a video camera, a car navigation apparatus, a pager, an electronic pocketbook, an electronic paper, a calculator, a word processor, a work station, a television phone, a POS terminal, a video player, and an apparatus having a touch panel, in addition to the electronic apparatuses shown in FIGS. 12 to 14.

The entire disclosure of Japanese Patent Application No. 2007-325590, filed Dec. 18, 2007 is expressly incorporated by reference herein.

What is claimed is:

1. A light emitting device comprising:
a substrate;
a plurality of pixel electrodes arranged in a matrix including a plurality of columns having two or more pixel electrodes arranged continuously in a first direction on the substrate;
a counter electrode disposed opposite the plurality of pixel electrodes;
a partition wall layer having a plurality of openings including a first opening and a second opening between the substrate and the counter electrode; and
an interlayer insulating film disposed between the substrate and the plurality of pixel electrodes,
wherein the plurality of pixel electrodes includes a first pixel electrode group including two or more of the plurality of pixel electrodes arranged continuously in the first direction,
wherein the first pixel electrode group includes a first pixel electrode and a second pixel electrode arranged to be adjacent to each other and a third pixel electrode and a fourth pixel electrode arranged to be adjacent to each other,
wherein a first division portion is disposed between the first pixel electrode and the second pixel electrode,
wherein a second division portion is disposed between the third pixel electrode and the fourth pixel electrode, and
wherein at least one light-emitting function layer including a plurality of layers including a light-emitting layer is formed between two or more pixel electrodes located between the first division portion and the second division portion in the first pixel electrode group and the counter electrode to cover the two or more pixel electrodes located between the first division portion and the second division portion,
wherein the first opening receives the two or more pixel electrodes located between the first division portion and the second division portion,
wherein the first division portion is formed of a part of the partition wall layer or a part of the interlayer insulating film,
wherein the second division portion is formed of a part of the partition wall layer or a part of the interlayer insulating film, and
wherein the second opening receives three or more pixel electrodes and the second opening receives more pixel electrodes than the first opening.

2. The light emitting device according to claim 1, wherein at least a part of the first division portion and the second division portion have a liquid repellency property relative to the material of the light-emitting layer.

3. The light emitting device according to claim 1, wherein the two or more pixel electrodes located between the first division portion and the second division portion and including the second pixel electrode and the third pixel electrode includes a fifth pixel electrode and a sixth pixel electrode arranged to be adjacent to each other, wherein a third division portion formed of a part of the interlayer insulating film is disposed between the fifth pixel electrode and the sixth pixel electrode, and wherein the layer of the light-emitting function layer closest to the substrate is divided by the third division portion.

4. The light emitting device according to claim 3, wherein the second division portion is formed of a part of the interlayer insulating film, and wherein the width of the second division portion in the first direction is greater than that of the third division portion.

5. The light emitting device according to claim 1, wherein the plurality of pixel electrodes includes a second pixel electrode group including two or more pixel electrodes arranged continuously in the first direction to form a column different from the column of the first pixel electrode group, wherein the second pixel electrode group includes a seventh pixel electrode arranged in the same row as the first pixel electrode in the first direction and an eighth pixel electrode arranged in the same row as the second pixel electrode in the first direction, and wherein a division portion corresponding to the first division portion is not disposed between the seventh electrode and the eighth electrode.

6. The light emitting device according to claim 1, wherein the second opening is disposed at a position adjacent to the first opening in the first direction and receives at least the first pixel electrode therein.

7. The light emitting device according to claim 1, wherein the light-emitting function layer is formed by a liquid droplet ejecting method.

8. An electronic apparatus comprising the light emitting device according to claim 1.

9. The light emitting device according to claim 1, wherein the partition wall includes a plurality of first openings and second openings, one of the plurality of first openings is disposed at an uppermost position and the plurality of second openings are disposed downstream of the first opening in even numbered columns, and only the plurality of second openings are disposed in odd numbered columns such that adjacent columns have different arrangement patterns.

* * * * *